United States Patent [19]

Shimizu

[11] 4,116,725

[45] Sep. 26, 1978

[54] HEAT TREATMENT OF CADMIUM MERCURY TELLURIDE AND PRODUCT

[75] Inventor: Harry H. Shimizu, Trail, Canada

[73] Assignee: Cominco Ltd., Trail, Canada

[21] Appl. No.: 718,636

[22] Filed: Aug. 30, 1976

[30] Foreign Application Priority Data

Jun. 11, 1976 [CA] Canada .................................. 254698

[51] Int. Cl.² .............................................. C22F 1/02
[52] U.S. Cl. ................................ 148/20.3; 75/134 H; 75/151; 75/169; 148/1.5; 148/32
[58] Field of Search ...................... 148/13.1, 20.3, 1.5, 148/32; 75/134 H, 151, 169; 252/62.3 ZT, 62.3 V, 501; 423/508

[56] References Cited

U.S. PATENT DOCUMENTS

| 3,954,518 | 5/1976 | Schmit et al. | 148/1.5 |
| 3,979,232 | 9/1976 | Hager et al. | 148/1.5 |

*Primary Examiner*—R. Dean
*Attorney, Agent, or Firm*—Arne I. Fors

[57] ABSTRACT

A method of improving certain characteristics of cadmium mercury telluride single crystal material by heat treating the single crystal material in the presence of both tellurium and mercury.

11 Claims, No Drawings

HEAT TREATMENT OF CADMIUM MERCURY TELLURIDE AND PRODUCT

BACKGROUND OF THE INVENTION

This invention relates to the preparation of cadmium mercury telluride and, more particularly, to a method of improving single crystal cadmium mercury telluride by heat treatment.

Cadmium mercury telluride of the general composition represented by the formula $Cd_xHg_{1-x}Te$ may be prepared by a number of methods which comprise vapor-phase epitaxy, liquid-phase epitaxy and melt-growth techniques. Such methods as the modified Bridgman and the Harman techniques enable the preparation of homogeneous single crystals of cadmium mercury telluride, hereinafter referred to as CMT.

In spite of careful preparation of single crystals of CMT, defects such as vacancies or dislocations in the crystal lattice and small compositional gradients cannot be entirely eliminated. The prior art discloses a number of methods to reduce these defects and gradients. One of these methods is to subject CMT to a heat treatment or an annealing process. For example, it has been disclosed in U.S. Pat. No. 3,622,405, which issued on Nov. 23, 1971 to J. L. Schmit, that compositional gradients in a body of CMT can be removed by annealing at a temperature which is greater than the solidus temperature and less than the liquidus temperature for the average composition of the body. Further annealing may be done at temperatures below the solidus temperature. In U.S. Pat. No. 3,723,190, which issued on Mar. 27, 1973 to P. W. Kruse et al., it has been disclosed that a CMT alloy is subjected to two heat treatments for controlling the stoichiometry, conductivity type and free carrier concentration. According to this patent, a CMT alloy is heated in a first heat treatment in an evacuated container at a temperature near but below the solidus temperature of the material for a time sufficient to ensure a homogeneous composition and is heated in a second heat treatment in the presence of mercury vapor at a second temperature for a time sufficient to adjust stoichiometry, conductivity type and free carrier concentration.

Although the heat treatments according to the prior art, including the heat treatment in mercury vapor, reduce crystal defects and improve some characteristics of the crystals, certain deficiencies remain. I have observed that single crystals of CMT, which have been subjected to heat treatment in mercury vapor, have variable electrical properties. More particularly, I have observed that considerable variations occur in electron mobility and resistivity in single crystals of CMT.

STATEMENT OF THE INVENTION

I have now discovered that deficiencies in single crystals of CMT can be substantially reduced by subjecting single crystal material to heat treatment in the presence together of both tellurium and mercury vapors, whereby certain characteristics of the material are improved.

Thus, there is provided a method for the treatment of cadmium mercury telluride single crystal material to improve certain characteristics of the said material which comprises subjecting cadmium mercury telluride single crystal material to heat treatment at a temperature in the range of 200° to 400° C. in the conjoint presence of tellurium and mercury.

More specifically, my invention consists of a method for treatment of cadmium mercury telluride single crystal material to produce a material having improved carrier lifetime and improved uniformity which includes subjecting single crystal cadmium mercury telluride represented by the formula $Cd_xHg_{1-x}Te$ wherein $x$ has values in the range of 0.17 to 0.40 to heat treatment at a temperature in the range of 200° to 400° C. in the conjoint presence of tellurium and mercury and maintaining the temperature of the cadmium mercury telluride up to about 40° C. above the temperatures of the tellurium and the mercury.

It is, therefore, an object of the present invention to provide a method for the heat treatment of CMT single crystal material to improve certain characteristics of the said material.

Other objects of the invention and the manner in which they can be attained will become apparent from the following detailed description of the invention.

DESCRIPTION OF THE PREFERRED EMBODIMENTS

CMT material having compositions represented by the general formula $Cd_xHg_{1-x}Te$, wherein X has values between 0.17 and 0.40, can be prepared as homogeneous single crystals from electronic grade starting materials using a modified Harman tecnhique. The Harman technique is described in the Journal of Electronic Materials, Volume 1, No. 2, Page 230, 1972. The method used for the preparation of CMT is not intended to limit the scope of the invention. CMT single crystals as prepared by the Harman tecnhique are generally of the p-type which can be used for photovoltaic applications. For photoconductive applications n-type crystals are often used. A commonly employed method of converting p-type to n-type is carried out by heat treating the p-type crystals for a long period of time in mercury vapor. The single crystal material is preferably prepared as, or cut, into thin slices or wafers, which are subjected to the heat treatment process.

According to the method of the invention, slices or wafers of homogeneous, single crystal CMT are carefully cleaned and placed in a suitable clean container, such as an ampoule, together with a small amount of high purity tellurium and a small amount of high purity mercury. The ampoule is evacuated, sealed, placed in a furnace and subsequently heated at elevated temperatures for a period of time sufficient to effect improvement in characteristics of the CMT, as will be described hereinbelow. After the required time, the ampoule is removed from the furnace and the slices of treated CMT are recovered.

In charging the ampoule, it is advantageous to place the slices in one end and the tellurium and mercury separate from the slices in the opposite end. However, the invention is not to be limited by the relative position of the charged materials. Preferably the tellurium and the mercury are placed in proximity to each other or, most preferably, in contact with each other, in the ampoule spaced from the CMT to be treated.

The furnace is heated in such a way that the CMT in the ampoule is maintained at a temperature equal to or higher than the temperatures of the tellurium and the mercury. During treatment, mercury must be prevented from condensing directly onto the CMT because of the solubility of CMT in mercury. To ensure that condensation does not take place, I prefer to maintain the CMT at a temperature which is at least very slightly higher than the temperature of the mercury.

It has been proposed that mercury vacancies affect the characteristics of CMT single crystal material and vacancies in the crystal lattice may be compensated by diffusion of mercury. Mercury vacancies, however, are not the only defects which affect the characteristics of CMT single crystal material. I have found that a loss of tellurium occurs when the heat treatment is carried out in the presence of mercury only. The mercury source appears to act as a solvent for tellurium and gains a measurable amount of tellurium while the CMT loses tellurium. Although I am not bound by theoretical explanations, I believe that this loss of tellurium is at least partly responsible for causing the resistivity (one of the characteristics of CMT) of the surface of CMT single crystals heat treated in mercury to be different from that of the interior of the crystals. I have found that variations in resistivity through the thickness of slices of single crystal CMT are reduced when a small amount of tellurium, for example, in the form of a small piece or chip, is placed in the ampoule preferably in proximity to or, most preferably, in contact with a small amount of mercury, for example, in the form of a droplet. The mercury becomes saturated with tellurium from the small piece or chip or tellurium during the heat treatment which will affect the loss of tellurium from the slices of CMT. Depending on heating conditions, the concentration of tellurium in the initially pure mercury in the ampoule may attain values of 50 ppm to 1000 ppm or more.

During the treatment, the temperature of the slices of CMT is maintained at values of up to about 40° C. above the temperatures of the tellurium and the mercury. A difference of more than 40° C. is not desirable. I prefer to maintain the difference at a positive value, i.e. greater than zero, to prevent the possibility of mercury condensation on the slices.

Preferably, the temperatures of the CMT slices, the tellurium and the mercury are maintained in the range of 200° to 400° C. The upper limit of the temperature of the slices is governed by the composition of the CMT and the activity coefficients of the three constituents of CMT.

For CMT compositions represented by the general formula $Cd_xHg_{1-x}Te$, having values of $x$ in the range of 0.17 to 0.23, the temperature of the slices is maintained at a value in the range of 200° to 290° C. and the temperatures of the tellurium and the mercury are maintained at values in the range of 200° to 250° C., while maintaining a positive difference between the temperature of the slices and the temperatures of the tellurium and the mercury of up to 40° C. The temperatures of the tellurium and the mercury are preferably maintained at the same value and the differences between the temperatures of the slices and those of the tellurium and the mercury are maintained in such a manner that the slices are at a temperature higher than those of the tellurium and the mercury at all times. Preferably, the temperature of the slices is maintained at a value in the range of 205° to 280° C. and the temperatures of the tellurium and the mercury at values in the range of 200° to 250° C., the latter temperatures preferably being the same, while maintaining the temperature of the slices preferably from 5° to 30° C. above the temperatures of the tellurium and the mercury. The most preferred temperature of the slices is 250° C. and those of the tellurium and the mercury are 240° C.

For CMT compositions having values of $x$ in the range of 0.23 to 0.40, the temperatures of the slices, and tellurium and mercury are maintained at values in the range of 240° to 400° C., while maintaining a difference between the temperature of the slices and those of the tellurium and the mercury of up to 20° C. in such a manner that the temperature of the slices is above the temperatures of the tellurium and the mercury at all times. The temperatures of the tellurium and the mercury are preferably the same.

The period of time required for the heat treatment varies with the thickness of the CMT slices. A period of up to 6 weeks or longer may be required for the heat treatment. It is, of course, understood that a multiplicity of slices can be treated simultaneously, the slices being arranged in the ampoule in such a manner that the total surface area of the slices is fully exposed to the tellurium and the mercury vapors during the treatment.

The CMT prepared according to the above described method has certain improved characteristics. Reduced differences in resistivity values at the surface and in the interior of treated CMT material result in more uniform values of electron mobility. The lifetime of photon-induced carriers is also improved.

The invention will now be described by means of the following non-limitative examples.

In the examples, it will be demonstrated that the characteristics of CMT are improved when CMT single crystal material is subjected to heat treatment in the presence of tellurium and mercury compared to material treated in the presence of mercury only.

The characteristics of resistivity and electron mobility have been determined using the van der Pauw technique, which is described in Philips Technical Review, 20, 220 (1959). According to this technique, the two above mentioned characteristics are measured at 77° K. (degrees Kelvin) on the bulk of slices of CMT. Material is then progressively and carefully removed from the surfaces of slices and the measurements repeated. The removal and measuring steps are carefully repeated until variations in the characteristics become clearly evident. The amount of material that must be removed varies with the heat treatment of the CMT. After the measurements have been completed, the conductivity type of the CMT material if determined by the thermoprobe method. All material used in the following examples was proved to be n-type material.

The characteristic of carrier lifetime has been determined by measuring the photo-response times using a pulsed gallium arsenide laser which emits 0.9 $\mu$m radiation. According to this determination, slices of CMT are prepared and irradiated with laser light. Logarithmic decay time constants are calculated from the decay curves of the photo-excited voltage rise.

EXAMPLE I

Slices of 0.7 to 0.8 mm thickness were cut from a homogeneous single crystal of CMT having the formula $Cd_xHg_{1-x}Te$ wherein $x = 0.20$. The slices were lapped on both surfaces to a thickness of 0.5 mm and cleaned with distilled water and organic solvents. The cleaned slices were etched in a 5% solution of bromine in methyl alcohol, rinsed thoroughly in methyl alcohol and dried. A number of slices with a combined weight of 10g were then placed in one end of a glass ampoule 13 cm long. A chip of tellurium weighing 0.01 g and an amount of mercury weighing 0.4 g were placed in contact with each other in the other end of the ampoule.

The ampoule was evacuated to less than 0.1 mm mercury pressure and sealed. The sealed ampoule was placed in a horizontal tubular furnace which was heated in such a manner that the slices were at a temperature of 250° C. and the tellurium and the mercury at 240° C. These temperatures were maintained during the treatment period of 5 weeks. After completion of this period the ampoule was removed from the furnace and the slices were recovered from the ampoule.

EXAMPLE II

For comparative purposes, slices of CMT were treated using the method and apparatus described in the previous example, except only mercury was present during the heat treatment. After heat treatment at the same temperatures and for the same period as used in Example I, the slices were recovered from the ampoule.

Slices of CMT treated in the presence of tellurium and mercury and slices treated in the presence of mercury alone, obtained according to Example I and Example II, respectively, were subjected to measurements of their resistivity and electron mobility at 77° K. according to the van der Pauw technique described above. Results of these measurements are given in Table 1 for CMT annealed in the presence of tellurium and mercury and in Table 2 for CMT annealed in the presence of mercury only. In the removal of material from the slices according to this technique, substantially the same amount of surface material was removed from each of the slices.

Table 1

| Sample No. | Value of x | Condition of Slice | Resistivity ohm.cm | Mobility $cm^2/v.s.$ |
|---|---|---|---|---|
| 1 | 0.210 | original | 0.036 | $1.8 \times 10^5$ |
|   |       | after*   | 0.051 | $1.5 \times 10^5$ |
| 2 | 0.210 | original | 0.046 | $1.6 \times 10^5$ |
|   |       | after*   | 0.058 | $1.3 \times 10^5$ |
| 3 | 0.200 | original | 0.064 | $1.6 \times 10^5$ |
|   |       | after*   | 0.110 | $1.0 \times 10^5$ |
| 4 | 0.205 | original | 0.045 | $1.9 \times 10^5$ |
|   |       | after*   | 0.063 | $1.4 \times 10^5$ |
| 5 | 0.208 | original | 0.074 | $1.5 \times 10^5$ |
|   |       | after*   | 0.110 | $1.1 \times 10^5$ |

Table 2

| Sample No. | Value of x | Condition of Slice | Resistivity ohm.cm | Mobility $cm^2/v.s.$ |
|---|---|---|---|---|
| 1 | 0.210 | original | 0.097 | $1.5 \times 10^5$ |
|   |       | after*   | 0.260 | $5.3 \times 10^4$ |
| 2 | 0.200 | original | 0.049 | $2.0 \times 10^5$ |
|   |       | after*   | 0.110 | $1.0 \times 10^5$ |
| 3 | 0.205 | original | 0.044 | $1.9 \times 10^5$ |
|   |       | after*   | 0.310 | $3.6 \times 10^4$ |

* = after removal of material from slices.

A comparison between the figures presented in Table 1 and Table 2 clearly illustrates the improvement in the uniformity of resistivity and electron mobility of CMT crystals treated in the presence of tellurium and mercury over CMT crystals treated in the presence of mercury alone. The consistency of producing CMT treated in presence of tellurium and mercury having such improved uniformity in resistivity and electron mobility is also improved, thus making the processing of CMT materials more economical as compared with the process wherein treatment is accomplished in presence of mercury only.

EXAMPLE III

This example illustrates the improvement in carrier lifetime of slices of single crystal CMT treated in the presence of tellurium and mercury over that of slices treated in the presence of mercury alone.

Slices of CMT single crystal material were cut in half, each slice producing a half A and half B. Halves A were treated in the presence of mercury only and halves B were treated in the presence of both tellurium and mercury for 5 weeks at a temperature of the half slices of 250° C. and a temperature of the mercury and the temperatures of the tellurium and mercury, respectively, of 240° C. After the treatment, the half slices were lapped, mechanically polished and chemically polished to prepare 4 samples of halves A and corresponding halves B, measuring about $10 \times 2 \times 0.1$ mm, for the measuring of carrier lifetime according to the method described above. The results are given in Table 3.

Table 3

| Sample No. | Lifetime Halves A ns | Lifetime Halves B ns |
|---|---|---|
| 1 | 200 | 360 |
| 2 | 300 | 580 |
| 3 | 400 | 800 |
| 4 | 240 | 890 |

The results show that the carrier lifetime of CMT single crystal material treated in the conjoint presence of tellurium and mercury is about two to three times longer than that of CMT material treated in the presence of mercury only. CMT material with a longer lifetime is known to be dominantly beneficial in photoconductive detectors.

It will be understood, of course, that modifications can be made in the embodiment of the invention illustrated and described herein without departing from the scope and purview of the invention as defined by the appended claims.

What I claim as new and desire to protect by Letters Patent of the United States is:

1. A method for improving carrier lifetime of and reducing resistivity differences in n-type cadmium mercury telluride homogeneous single crystal material which includes subjecting single crystal cadmium mercury telluride represented by the formula $Cd_xHg_{1-x}Te$ wherein x has values in the range of 0.17 to 0.40 to heat treatment at a temperature in the range of 200° to 400° C. in the conjoint presence of tellurium and mercury and maintaining the temperature of the cadmium mercury telluride in the range of from about 5° to about 40° C. above the temperatures of the tellurium and the mercury.

2. A method as claimed in claim 1, wherein the single crystal material is in the form of slices, x has values in the range of 0.17 to 0.23, the temperature of the slices is maintained in the range of 205° to 280° C., the temperatures of the tellurium and the mercury are maintained in the range of 200° to 250° C. and the temperature of the slices is maintained from 5° to 30° C. above the temperatures of the tellurium and the mercury.

3. A method as claimed in claim 1 wherein the tellurium and the mercury are in proximity to each other and are maintained at the same temperature.

4. A method as claimed in claim 1 wherein the tellurium and the mercury are in contact with each other and are maintained at the same temperature.

5. A method as claimed in claim 2 wherein the tellurium and the mercury are in contact with each other and are maintained at the same temperature.

6. A method as claimed in claim 1 wherein the single crystal material is in the form of slices, x has values in the range of 0.23 to 0.40, the temperatures of the slices, the tellurium and the mercury are maintained in the range of 240° to 400° C. and the temperature of the slices is maintained from 5° to about 20° C. higher than the temperatures of the tellurium and the mercury.

7. A method as claimed in claim 6 wherein the tellurium and the mercury are in contact with each other and wherein the temperatures of the tellurium and the mercury are the same.

8. A method for improving carrier lifetime of and reducing resistivity differences in n-type cadmium mercury telluride homogeneous single crystal material which comprises placing slices of said cadmium mercury telluride represented by the formula $Cd_xHg_{1-x}Te$ wherein $x$ has values in the range of 0.17 to 0.23 in one end of an ampoule, placing a droplet of mercury and a chip of tellurium in contact with each other in the other end of the ampoule, evacuating and sealing the ampoule, heating the ampoule to elevated temperatures and maintaining said elevated temperatures so that the slices are at a temperature of about 250° C. and the tellurium and the mercury are at the same temperature of about 240° C. for a period of up to about 6 weeks.

9. Cadmium mercury telluride single crystals, said crystals represented by the general formula $Cd_xHg_{1-x}Te$ wherein $x$ has values in the range of 0.17 to 0.40 as prepared by the method of claim 1, said crystals having improved carrier lifetime and improved uniformity in resistivity.

10. Cadmium mercury telluride single crystals, said crystals represented by the general formula $Cd_xHg_{1-x}Te$ wherein $x$ has values in the range of 0.17 to 0.23 as prepared by the method of claim 2, said crystals having improved carrier lifetime and improved uniformity in resistivity.

11. Cadmium mercury telluride single crystals, said crystals represented by the general formula $Cd_xHg_{1-x}Te$ wherein $x$ has values in the range of 0.23 to 0.40 as prepared by the method of claim 6, said crystals having improved carrier lifetime and improved uniformity in resistivity.

* * * * *